United States Patent
Byun et al.

(10) Patent No.: US 10,199,593 B2
(45) Date of Patent: Feb. 5, 2019

(54) DISPLAY DEVICE AND MANUFACTURING METHOD OF THE SAME

(71) Applicant: SAMSUNG DISPLAY CO., LTD., Yongin-si, Gyeonggi-do (KR)

(72) Inventors: Sang Chul Byun, Yongin-si (KR); Hyuk Hwan Kim, Yongin-si (KR); Seok Hyun Nam, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/858,151

(22) Filed: Dec. 29, 2017

(65) Prior Publication Data

US 2018/0226597 A1 Aug. 9, 2018

(30) Foreign Application Priority Data

Feb. 9, 2017 (KR) ........................ 10-2017-0018010

(51) Int. Cl.
| | |
|---|---|
| *H01L 33/58* | (2010.01) |
| *H01L 51/50* | (2006.01) |
| *H01L 51/56* | (2006.01) |
| H01L 27/32 | (2006.01) |
| H01L 51/52 | (2006.01) |
| H01L 33/50 | (2010.01) |

(Continued)

(52) U.S. Cl.
CPC ............ *H01L 51/502* (2013.01); *H01L 51/56* (2013.01); *H01L 27/322* (2013.01); *H01L 27/3248* (2013.01); *H01L 27/3253* (2013.01); *H01L 27/3258* (2013.01); *H01L 27/3276* (2013.01); *H01L 33/387* (2013.01); *H01L 33/504* (2013.01); *H01L 33/62* (2013.01); *H01L 51/5212* (2013.01); *H01L 51/5215* (2013.01)

(58) Field of Classification Search
CPC ............ H01L 27/3248; H01L 27/3276; H01L 27/322; H01L 33/387; H01L 33/504; H01L 33/62
USPC ............................................... 257/99; 438/28
See application file for complete search history.

(56) References Cited

U.S. PATENT DOCUMENTS

| | | | |
|---|---|---|---|
| 7,842,958 B1 * | 11/2010 | Sekine | H01L 33/382 257/88 |
| 8,933,473 B1 * | 1/2015 | Dubin | H01L 25/167 257/79 |
| 9,349,911 B2 | 5/2016 | Lau et al. | |

(Continued)

FOREIGN PATENT DOCUMENTS

KR 10-2015-0080135 A 7/2015

*Primary Examiner* — George Fourson, III
(74) *Attorney, Agent, or Firm* — Innovation Counsel LLP (57) ABSTRACT

A display device comprises: a light emitting array including a plurality of light emitting elements on a substrate and an insulating pattern disposed between the light emitting elements; a color conversion array including a plurality of sub-color conversion parts corresponding to the respective light emitting elements; and a printed circuit board having a first contact electrode connected to each of the light emitting elements, the printed circuit board driving the light emitting elements, wherein the plurality of sub-color conversion parts include first to third sub-color conversion parts that convert the light provided from corresponding light emitting elements into lights of first to third colors and emitting the converted lights, wherein each of the plurality of light emitting elements is electrically insulated from an adjacent light emitting elements.

20 Claims, 7 Drawing Sheets

(51) Int. Cl.
*H01L 33/62* (2010.01)
*H01L 33/38* (2010.01)

(56) References Cited

U.S. PATENT DOCUMENTS

| | | |
|---|---|---|
| 9,618,681 B2 | 4/2017 | Cheng et al. |
| 2010/0252841 A1* | 10/2010 | Cok .................... H01L 27/3209 257/89 |
| 2012/0223875 A1* | 9/2012 | Lau ...................... H01L 27/156 345/83 |
| 2014/0034985 A1* | 2/2014 | Pan .................... H01L 33/0079 257/98 |
| 2018/0012949 A1* | 1/2018 | Takeya .................... H01L 27/15 |
| 2018/0233494 A1* | 8/2018 | Takeya ................ H01L 25/0753 |

\* cited by examiner

DISPLAY DEVICE AND MANUFACTURING METHOD OF THE SAME

RELATED APPLICATIONS

The present application claims priority to Korean Patent Application No. 10-2017-0018010, filed on Feb. 9, 2017, in the Korean Intellectual Property Office, the entire disclosure of which is incorporated by reference herein.

BACKGROUND

1. Field

An aspect of the present disclosure relates to a display device and a manufacturing method of the same.

2. Description of the Related Art

Light emitting diodes (LEDs) have advantages of low heat and a long lifespan due to a low driving voltage and high energy efficiency. The LEDs are expected to replace currently used most light source devices with the development of techniques capable of providing white light with high luminance.

Recently, there has been developed a display device in which a plurality of light emitting units each including such an LED are arranged in a matrix form, thereby implementing a display element.

SUMMARY

Embodiments provide a display device having improved reliability.

According to an aspect of the present disclosure, there is provided a display device comprising: a light emitting array including a substrate, a plurality of light emitting elements arranged in a matrix form on the substrate, the plurality of light emitting elements generating light, and an insulating pattern provided between the plurality of light emitting elements; a color conversion array including a plurality of sub-color conversion parts corresponding to the respective light emitting elements, the plurality of sub-color conversion parts each converting the light into light of a specific color for each of the plurality of light emitting elements and emitting the converted light; and a printed circuit board having a first contact electrode connected to each of the plurality of light emitting elements, the printed circuit board driving the plurality of light emitting elements, wherein the plurality of sub-color conversion parts include first to third sub-color conversion parts that convert the light provided from corresponding light emitting elements into lights of first to third colors and emitting the converted lights, wherein each of the plurality of light emitting elements is electrically insulated from an adjacent light emitting element.

Each light emitting element may include: an active layer; a first semiconductor layer disposed on the active layer; a first electrode disposed on the first semiconductor layer; a second semiconductor layer disposed between the active layer and the substrate; and a second electrode disposed between the second semiconductor layer and the insulating pattern.

The first electrode may be electrically connected to the first contact electrode.

The display device may further include an adhesive layer disposed between the color conversion array and the light emitting array.

The adhesive layer may include a second contact electrode electrically connected to the second electrode and an adhesive film disposed corresponding to the first semiconductor layer.

The printed circuit board may further include a second contact electrode electrically connected to the second electrode.

The second contact electrode may be spaced apart from an adjacent second contact electrode at a predetermined distance on the printed circuit board, and be electrically insulated from the first contact electrode.

The adhesive layer may include an adhesive film disposed corresponding to the first semiconductor layer and a light blocking layer disposed corresponding to the insulating pattern.

The adhesive film may include a transparent silicon material, and the light blocking layer may include a black matrix.

The first sub-color conversion part may include a first quantum dot that emits light of the first color, and the second sub-color conversion part may include a second quantum dot that emits light of the second color.

The light of the first color may be red light, and the light of the second color may be green light.

Each of the plurality of light emitting elements may include a light emitting diode that emits blue light.

At least one sub-color conversion part among the first to third sub-color conversion parts may include a transparent layer that allows the blue light to be transmitted therethrough.

According to an aspect of the present disclosure, there is provided a method of manufacturing a display device comprising: forming a light emitting array, wherein the light emitting array includes a plurality of light emitting elements that generate light and an insulating pattern provided between the plurality of light emitting elements; forming a printed circuit board, wherein the printed circuit board includes a first contact electrode; mounting the light emitting array on the printed circuit board such that each light emitting elements is electrically connected to the first contact electrode; forming a color conversion array, wherein the color conversion array includes a plurality of sub-color conversion parts that correspond to the respective light emitting elements and each converts the light into light of a specific color for each of the plurality of light emitting elements and emits the converted light; and disposing the color conversion array on the top of the light emitting array and then allowing the light emitting array and the color conversion array to be bonded to each other, wherein the plurality of sub-color conversion parts include first to third sub-color conversion parts, at least one of the first to third sub-color conversion parts converting the light provided from corresponding light emitting elements into light of first color and emitting the converted light.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The present disclosure may apply various changes and different shape, therefore only illustrate in details with particular examples. However, the examples do not limit to certain shapes but apply to all the change and equivalent material and replacement. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, exemplary embodiments of the present disclosure will be described in detail with reference to the accompanying drawings.

Figure 1:
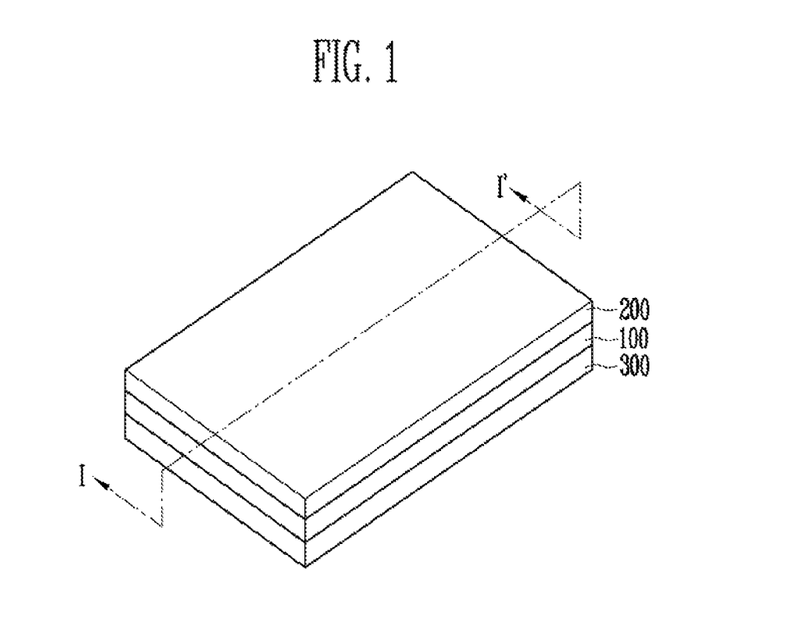
FIG. 1 is a perspective view illustrating a display device according to an embodiment of the present disclosure.
Figure 2:
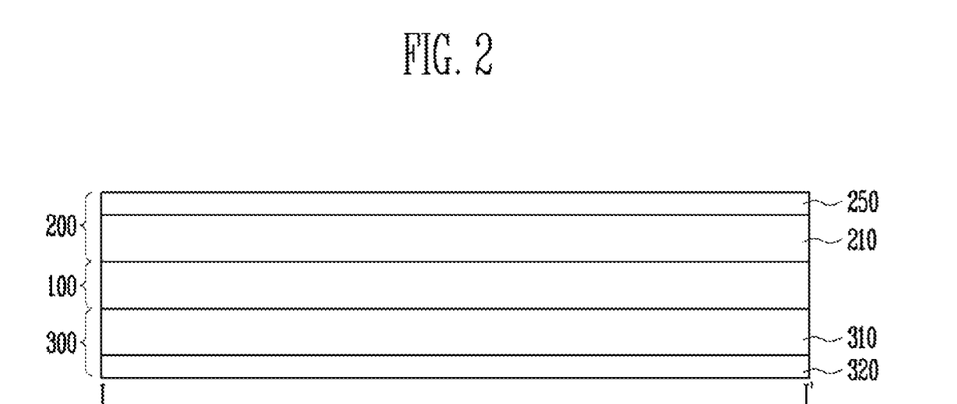
FIG. 2 is a sectional view taken along line I-I' of FIG. 1.
Figure 3:
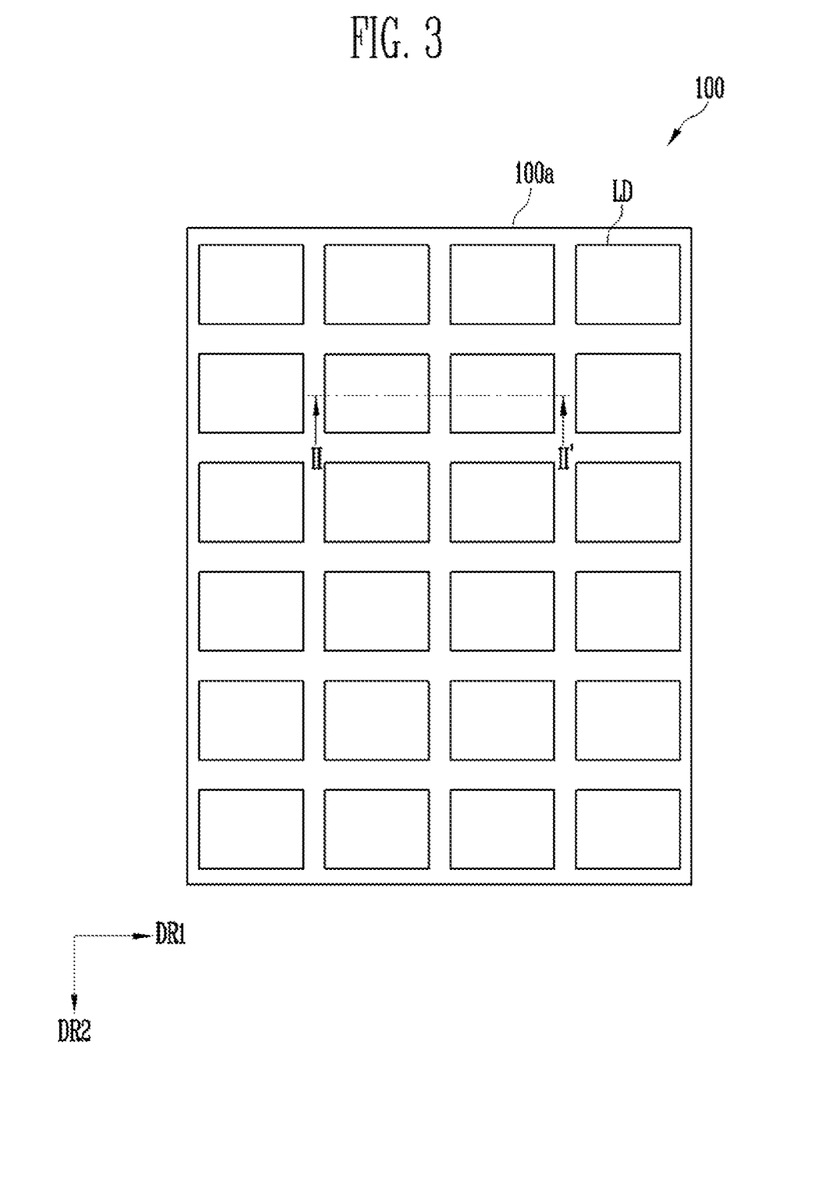
FIG. 3 is a plan view illustrating a light emitting array of FIG. 1.
Figure 4:
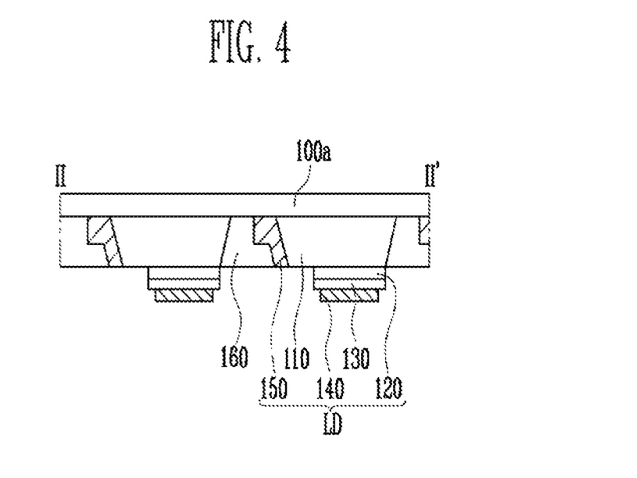
FIG. 4 is a sectional view taken along line II-II' of FIG. 3.

FIG. 1 is a perspective view illustrating a display device according to an embodiment of the present disclosure. FIG. 2 is a sectional view taken along line I-I' of FIG. 1. FIG. 3 is a plan view illustrating a light emitting array of FIG. 1. FIG. 4 is a sectional view taken along line II-II' of FIG. 3.

Referring to FIGS. 1 to 4, the display device according to the embodiment of the present disclosure may be provided in various shapes. For example, the display device may be provided in a rectangular plate shape having two pairs of sides parallel to each other, but the present disclosure is not limited thereto. When the display device is provided in the rectangular plate shape, any one pair of sides among the two pairs of sides may be provided longer than the other pair of sides.

The display device according to the embodiment of the present disclosure may include a light emitting array 100, a color conversion array 200, and a driving array 300.

The light emitting array 100 may include a plurality of light emitting elements LD arranged on a display surface 100a. In an embodiment of the present disclosure, the display surface 100a may be a semiconductor substrate.

The plurality of light emitting elements LD may be arranged along a first direction DR1 of the display surface 100a. Also, the plurality of light emitting elements LD may be arranged along a second direction DR2 intersecting the first direction DR1. That is, the plurality of light emitting elements LD may be arranged in a matrix form on the display surface 100a. Each of the plurality of light emitting elements LD may be electrically separated from an adjacent light emitting element LD by an insulating pattern 160. Also, each of the plurality of light emitting elements LD may be electrically connected to the driving array 300 to be individually driven.

Each light emitting element LD may be a light emitting diode LED that includes a first semiconductor layer 130, an active layer 120, a second semiconductor layer 110 which includes a plurality of second semiconductor layer patterns, a first electrode 140, and a second electrode 150.

The first semiconductor layer 130 may be disposed on the active layer 120 to provide holes to the active layer 120. The first semiconductor layer 130 may include at least one p-type semiconductor layer. For example, the first semiconductor layer 130 may include at least one semiconductor material among InAlGaN, GaN, AlGaN, InGaN, AlN, and InN. The first semiconductor layer 130 may include a semiconductor layer doped with a first conductive dopant such as Mg. The material constituting the first semiconductor layer 130 is not limited thereto, and various materials may be included in the first semiconductor layer 130.

The active layer 120 may be disposed between the second semiconductor layer 110 and the first semiconductor layer 130 to convert extra energy into light by recombining electrons and holes, which are provided from the second semiconductor layer 110 and the first semiconductor layer 130. The active layer 120 may have a typical quantum well (QW) or a multiple quantum well (MQW) for improving efficiency, and a wavelength having a required band can be obtained by controlling compositions and thicknesses of well and barrier layers.

The second semiconductor layer 110 may be disposed on the display surface 100a to provide electrons to the active layer 120. The second semiconductor layer 110 may include an n-type semiconductor layer. For example, the second semiconductor layer 110 may include at least one semiconductor material among InAlGaN, GaN, AlGaN, InGaN, AlN, and InN. The second semiconductor layer 110 may include a semiconductor layer doped with a second conductive dopant such as Si, Ge, or Sn. The material constituting the second semiconductor layer 110 is not limited thereto, and various materials may be included in the second semiconductor layer 110.

The first electrode 140 may be disposed on the first semiconductor layer 130 to allow the first semiconductor layer 130 and the driving array 300 to be electrically stably connected to each other. To this end, the first electrode 140 may be in ohmic contact with a portion of the driving array 300. The first electrode 140 may be made of a transparent conductive material such as ITO, IZO, or ITZO such that light emitted from the active layer 120 can be transmitted therethrough, but the present disclosure is not limited thereto.

The second electrode 150 may be disposed between the second semiconductor layer 100 and the insulating pattern 160 which is disposed between adjacent second semiconductor layer patterns to allow the second semiconductor layer 110 and the color conversion array 200 to be electrically stably connected to each other. To this end, the second electrode 150 may be in ohmic contact with a portion of the color conversion array 200. The second electrode 150 may be made of a material having conductivity, for example, a metal or transparent conductive material such as ITO, IZO, or ITZO but the present disclosure is not limited thereto.

The plurality of light emitting elements LD having the above-described structure may be simultaneously formed on the display surface 100a. Also, the plurality of light emitting elements LD may be electrically separated from each other by the insulating pattern 160 disposed on the display surface 100a. Therefore, each of the plurality of light emitting element LD may be independently driven.

The color conversion array 200 may include a color conversion layer 210 that converts light emitted from the plurality of light emitting elements LD into light of a specific color and a coating layer 250 disposed on the color conversion layer 210.

The color conversion layer 210 may display arbitrary visual information, e.g., a text, a video, a picture, a two-dimensional or three-dimensional image, etc. by converting light provided from the plurality of light emitting element LD into light of a specific color. The coating layer 250 may be an anti-reflection layer for improving visibility of the color conversion layer 210.

The driving array 300 may include a printed circuit board 310 disposed on the bottom of the light emitting array 100 and a heat dissipation layer 320 disposed on a back surface of the printed circuit board 310.

The printed circuit board 310 may include a driver (not shown) that drives the plurality of light emitting elements LD and a contact electrode (not shown) electrically connected to the first electrode 140 of each of the plurality of light emitting elements LD. The heat dissipation layer 320 may dissipate heat generated from the driver to the outside.

The color conversion array 200 and the driving array 300 will be described in detail later with reference to FIG. 5.

Figure 5:
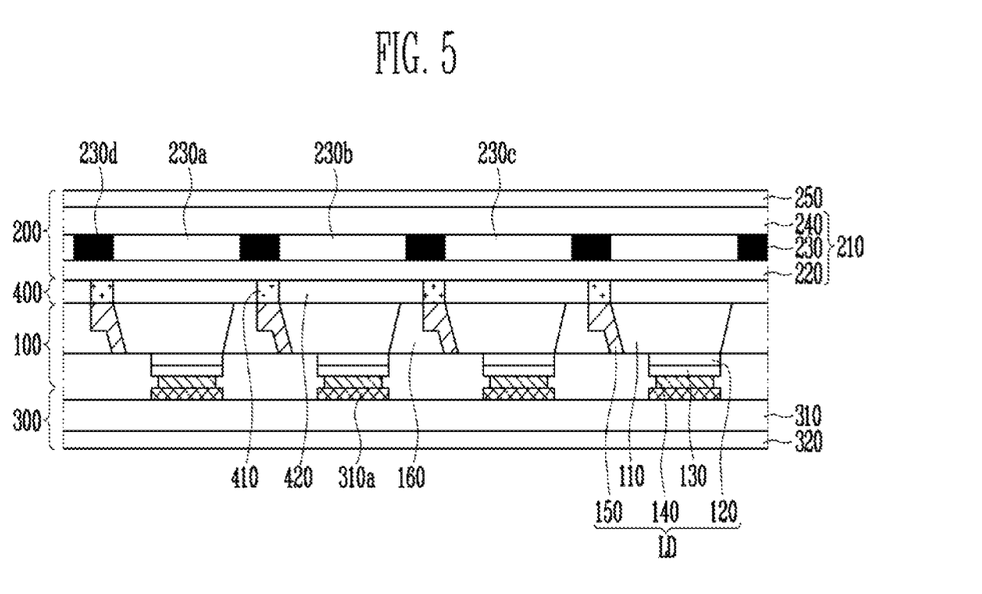
FIG. 5 illustrates a display device according to an embodiment of the present disclosure, which is a sectional view corresponding to line I-I' of FIG. 1.

FIG. 5 illustrates a display device according to an embodiment of the present disclosure, which is a sectional view corresponding to line I-I' of FIG. 1. In the embodiment of the present disclosure, differences from the above-described embodiment will be mainly described to avoid redundancy. Portions not particularly described in this embodiment follow those of the above-described embodiment. In addition, identical reference numerals refer to identical components, and similar reference numerals refer to similar components. In addition, for convenience, one light emitting device among a plurality of light emitting devices and components connected thereto will be mainly described.

Referring to FIGS. 1 and 5, the display device according to the embodiment of the present disclosure may include a light emitting array 100, a color conversion array 200, and a driving array 300. Also, the display device may include an adhesive layer 400 disposed between the light emitting array 100 and a color conversion array 200.

The light emitting array 100 may include a plurality of light emitting elements LD that generate light and an insulating pattern 160 provided between the light emitting elements LD.

Each of the plurality of light emitting elements LD may be a light emitting diode (LED) that includes a first semiconductor layer 130, an active layer 120, a second semiconductor layer 110, a first electrode 140, and a second electrode 150, and generates blue light. In an embodiment of the present disclosure, the second electrode 150 may be disposed between the insulating pattern 160 and the second semiconductor layer 110 and be connected to a second contact electrode 410 of the adhesive layer 400.

The insulating pattern 160 may include any one insulating material selected from an inorganic insulating material including an inorganic material and an organic insulating material including an organic material. Since the insulating pattern 160 is disposed between the light emitting elements LD, each light emitting element LD may be electrically insulated from an adjacent light emitting element LD.

The driving array 300 may include a printed circuit board 310 and a heat dissipation layer 320.

The printed circuit board 310 may include a driver (not shown) that drives a corresponding light emitting element LD and a first contact electrode 310a electrically connected to the first electrode 140 of each light emitting element LD.

In an embodiment of the present disclosure, the driver may be provided in plural numbers on the printed circuit board 310 as many as the number of the plurality of light emitting elements LD so as to individually drive the plurality of light emitting devices LD, but the present disclosure is not limited thereto. The driver may be electrically connected to one side of the first contact electrode 310a, and apply a first power source to the corresponding light emitting element LD through the first contact electrode 310a.

The first contact electrode 310a may be disposed on the printed circuit board 310 to be spaced apart from an adjacent first contact electrode 310a at a certain distance. The first electrode 140 may be electrically connected to the other side of the first contact electrode 310a.

Consequently, the first power source of the driver can be applied to the first electrode 140 of the corresponding light emitting element LD through the first contact electrode 310a.

The first contact electrode 310a is made of a conductive material. The conductive material may include a metal such as Ag, Mg, Al, Pt, Pd, Au, Ni, Nd, Ir, Cr, or an alloy thereof, a conductive oxide such as indium tin oxide (ITO), indium zinc oxide (IZO), zinc oxide (ZnO), or indium tin zinc oxide (ITZO), a conductive polymer such as PEDOT, and the like. In addition, the first contact electrode 310a may be formed in a single layer, but the present disclosure is not limited thereto. For example, the first contact electrode 310a may be formed in a multi-layer in which two or more materials among metals, alloys, conductive oxides, and conductive polymers are stacked.

The color conversion array 200 may include a color conversion layer 210 and a coating layer 250.

The color conversion layer 210 may include a first base substrate 240, a sub-color conversion part 230 disposed on the first base substrate 240, and a second base substrate 220 disposed on the sub-color conversion part 230.

The first base substrate 240 may be made of various materials, e.g., glass, polymer metal, and the like. In particular, the first base substrate 240 may be an insulative substrate made of a polymer organic material. The material of the insulative substrate including the polymer organic material may include polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and the like. However, the material constituting the first base substrate 240 is not limited thereto. For example, the first base substrate 240 may be made of a fiber reinforced plastic (FRP).

The sub-color conversion part 230 may include first to third sub-color conversion parts 230a, 230b, and 230c. In an embodiment of the present disclosure, each of the first to third sub-color conversion parts 230a, 230b, and 230c may correspond to one light emitting element LD.

A first sub-color conversion part 230a may convert blue light supplied from a corresponding light emitting element LD into light of a first color. Here, the light of the first color may be red light. That is, the first sub-color conversion part 230a may emit red light having a wavelength of about 620 nm to about 680 nm by absorbing the blue light supplied from the corresponding light emitting device LD and alter the wavelength of the blue light through energy transition. In an embodiment of the present disclosure, the first sub-color conversion part 230a may include a first quantum dot that converts blue light into red light.

A second sub-color conversion part 230b may convert blue light supplied from a corresponding light emitting element LD into light of a second color. Here, the light of the second color may be green light. That is, the second sub-color conversion part 230b may emit green light having a wavelength of about 500 nm to about 560 nm by absorbing the blue light supplied from the corresponding light emitting element LD and alter the wavelength of the blue light through energy transition. In an embodiment of the present disclosure, the second sub-color conversion part 230b may include a second quantum dot that converts blue light into green light.

In addition, the first and second quantum dots may be selected from a group consisting of a binary compound selected from the group consisting of a Group II-IV compound, a Group IV-VI compound, a Group IV element, a Group IV compound, and a combination thereof.

The Group II-VI compound may be selected from the group consisting of a binary element compound selected from the group consisting of CdSe, CdTe, ZnS, ZnSe, ZnTe, ZnO, HgS, HgSe, HgTe, MgSe, MgS, and a combination thereof; a ternary element compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdH CdHgSe, CdHgTe, HgZnS, HgZnSe, HgZnTe, MgZnSe, MgZnS, and a combination thereof; and a quaternary element compound selected from the group consisting of HgZnTeS, CdZnSeS, CdZnSeTe, CdZnSTe, CdHgSeS, CdHgSeTe, CdHgSTe, HgZnSeS, HgZnSeTe, HgZaSTe, and a combination thereof. The Group III-V compound may be selected from the group consisting of a binary element compound selected from the group consisting of GaN, GaP, GaAs, GaSb, AlN, AlP, AlAs, AlSb, InN, InP, InAs, InSb, and a combination thereof; a ternary element compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof, and a quaternary element compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group IV-VI compound may be selected from the group consisting of a binary element compound selected from the group consisting of SnS, SnSe, SnTe, PbS, PbSe, PbTe, and a combination thereof; a ternary element compound selected from the group consisting of SnSeS, SnSeTe, SnSTe, PbSeS, PbSeTe, PbSTe, SnPbS, SnPbSe, SnPbTe, and a combination thereof; and a quaternary element compound selected from the group consisting of SnPbSSe, SnPbSeTe, SnPbSTe, and a combination thereof. The Group IV element may be selected from the group consisting of Si, Ge, and a combination thereof. The Group IV compound may be a binary element compound selected from the group consisting of SiC, SiGe, and a combination thereof.

In this case, the binary element compound, the ternary element compound, or the quaternary element compound may have a uniform concentration in a particle, or the binary element compound, the ternary element compound, and the quaternary element compound may have partially different concentration distributions in the same particle. In addition, the first and second quantum dots may have a core/shell structure in which one quantum dot surrounds another quantum dot. An interface between a core and a shell may have a concentration gradient in which the concentration of an element at an edge of the shell decreases as the element approaches the center of the core.

The shape of the first and second quantum dots is not particularly limited to those generally used in the art. More specifically, the first and second quantum dots may include spherical, pyramidal, multi-armed, or cubit nano particles, nano tubes, nano wires, nano fabrics, nano planar particles, and the like.

The third sub-color conversion part 230c may allow blue light supplied from a corresponding light emitting element LD to be transmitted as it is therethrough. To this end, the third sub-color conversion pan 230c may include a transparent layer. The transparent layer may be made of a transparent polymer, and allow the blue light supplied rom the corresponding light emitting element LD to be transmitted therethrough, so that the blue light can be emitted as it is. The third sub-color conversion part 230c including the transparent layer may allow incident blue light to be emitted as it is without any separate quantum dot. In some embodiments, when the corresponding light emitting element LD generates white light, the third sub-color conversion part 230c may include a blue quantum dot that converts white light into blue light.

In addition, the sub-color conversion part 230 may further include a black matrix 230d disposed between the first to third color conversion parts 230a, 230b, and 230c.

As the black matrix 230d is disposed between the first to third color conversion parts 230a, 230b, and 230c, color mixture of the first to third color conversion parts 230a, 230b, and 230c can be prevented. Also, the black matrix 230d can prevent external light from being incident into structures of a corresponding light emitting element LD (e.g., including the second electrode 150 and the like of the light emitting element LD).

The second base substrate 220 may be a protective layer that covers the sub-color conversion part 230 and protects the sub-color conversion part 230 from an external influence, for example, physical or chemical shock from the outside. The second base substrate 220 may include the same material as the first base substrate 240, but the present disclosure is not limited thereto. For example, the second base substrate 220 may include a transparent polyimide film or a glass substrate.

The coating layer 250 may be an anti-reflection layer disposed on the first base substrate 240. As the coating layer 250 is disposed on the first base substrate 240, external light can be prevented from being incident into the first base substrate 240, thereby improving the visibility of the color conversion layer 210.

The adhesive layer 400 may be disposed between the light emitting array 100 and the color conversion array 200, and allow the light emitting array 100 and the color conversion array 200 to be bonded to each other. The adhesive layer 400 may include the second contact electrode 410 and an adhesive film 420.

The second contact electrode 410 may be provided in plurality to be electrically connected to the second electrode 150 of a corresponding light emitting element LD. Although not shown in the drawing, the second contact electrode 410 may be connected to the driver mounted on the printed circuit board 310 through wire bonding. The driver may be electrically connected to one side of the second contact electrode 410, and apply a second power source to the second electrode 150 of the corresponding light emitting element LD through the second contact electrode 410. Here, the second power source may be set to a voltage having a level different from that of the first power source.

The adhesive film 420 may be disposed between the second contact electrodes 410, and allow the second contact electrode 410 to be electrically separated from adjacent second contact electrodes 410. Also, the adhesive film 420 may be disposed between the second semiconductor layer 110 of a corresponding light emitting element LD and the second base substrate 220 to allow the light emitting array 100 and the color conversion array 200 to be bonded to each other. Also, the adhesive film 420 may protect the corresponding light emitting element LD. In an embodiment of the present disclosure, the adhesive film 420 may include a transparent silicon material.

As described above, the first electrode 140 of the light emitting element LD may be electrically connected to the first contact electrode 310a of the printed circuit board 310, and the second electrode 150 of the light emitting element LD may be electrically connected to the second contact electrode 410 of the adhesive layer 400. Therefore, the first power source of the driver may be applied to the first electrode 140 of the light emitting element LD, and the second power source of the driver may be applied to the second electrode 150 of the light emitting element LD. Thus, the light emitting element LD can generate light with a luminance corresponding to the first and second power sources respectively provided to the first and second electrodes 140 and 150 thereof. In this case, the luminance of the light generated by the light emitting element LD may be changed depending on levels of the first and second power sources respectively provided to the first and second electrodes 140 and 150.

Light generated by each of the light emitting elements LD may advance to the color conversion array 200 to be converted into light of a specific color. Therefore, an image may be displayed on one surface of the coating layer 250, e.g., a surface on which the color conversion layer 210 is not disposed.

In an embodiment of the present disclosure, the light emitting element LD may be electrically insulated from an adjacent light emitting element LD by the insulating pattern 160, and be electrically connected to each of the corresponding first and second contact electrodes 310a and 410. Accordingly, the light emitting element LD can be individually driven. The light emitting elements LD are arranged in a matrix form to implement a display element. In this case, as the light emitting elements LD are individually driven, display elements corresponding to the respective light emitting elements LD can be implemented as independent cells.

Further, as the light emitting elements LD are simultaneously formed in the light emitting array 100, a manufacturing process of the display device can be simplified.

In addition, each of the first to third sub-color conversion parts 230a, 230b, and 230c constitutes a display element together with a corresponding light emitting element LD. In the embodiment of the present disclosure, as the first and second sub-color conversion parts 230a and 230b include quantum dots, light having improved color purity and color reproduction can be emitted through the first and second sub-color conversion parts 230a and 230b.

FIGS. 6 to 12 are process sectional views illustrating a manufacturing method of the display device shown in FIG. 5.

Figure 6:
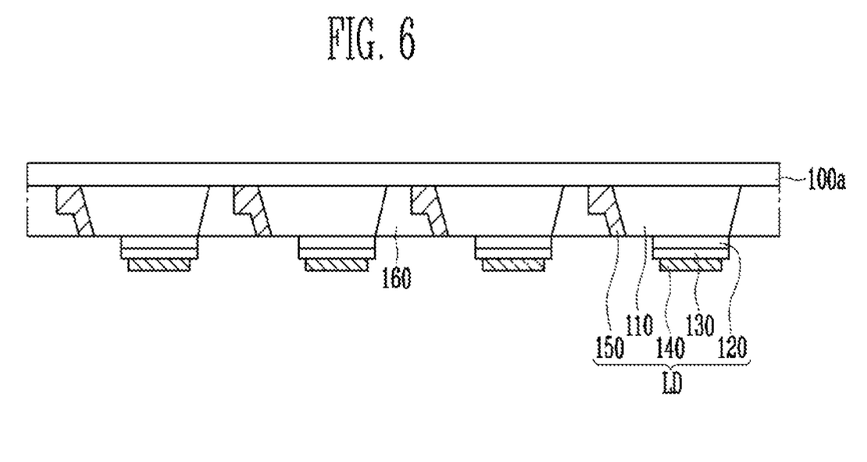
FIGS. 6, 7, 8, 9, 10, 11 and 12 are process sectional views illustrating a manufacturing method of the display device shown in FIG. 5.

First, referring to FIGS. 5 and 6, an insulating pattern 160 and a plurality of light emitting elements LD may be formed on a semiconductor substrate 100a.

Each of the plurality of light emitting elements LD may include a first semiconductor layer 130, an active layer 120, a second semiconductor layer 110, a first electrode 140, and a second electrode 150.

The semiconductor substrate 100a is used to allow the first semiconductor layer 130 to be grown thereon. The semiconductor substrate 100a may be a gallium nitride (GaN) substrate, but the present disclosure is not limited thereto. For example, the semiconductor substrate 100a may be any one substrate selected from a sapphire substrate, a silicon (Si) substrate, a silicon carbide (SiC) substrate, a gallium arsenide (GaAs) substrate, and zinc oxide (ZnO) substrate.

A second semiconductor forming material is formed on the semiconductor substrate 100a. The second semiconductor forming material is patterned using a conventional method to form the second semiconductor layer 110. A second electrode forming material is formed on the second semiconductor layer 110. The second electrode forming material is patterned using a conventional method to form the second electrode contacting at least one side surface of the second semiconductor layer 110. The insulating pattern 160 is formed on the semiconductor substrate 100a to be disposed between the light emitting elements LD. Therefore, each of the plurality of light emitting elements LD may be electrically insulated from an adjacent light emitting element LD. The insulating pattern 160 may be formed using a conventional planarization method such as an etch back method or a chemical mechanical polishing method. The insulating pattern 160 may completely fill gaps between the second electrode 150 and the second semiconductor layer 110. An active layer forming material, a first semiconductor layer forming material and a first electrode forming material are sequentially formed on the semiconductor substrate 100a. The active layer forming material, the first semiconductor layer forming material and the first electrode forming material are patterned using a conventional method to form the active layer 120, the first semiconductor layer 130 and the first electrode 140. The patterning of the active layer forming material, the first semiconductor layer forming material and the first electrode forming material may be performed using a single mask. However, the patterning of the active layer forming material, the first semiconductor layer forming material and the first electrode forming material may be performed using different masks.

In an embodiment of the present disclosure, the plurality of light emitting elements LD may be simultaneously formed on the semiconductor substrate 100a.

Figure 7:
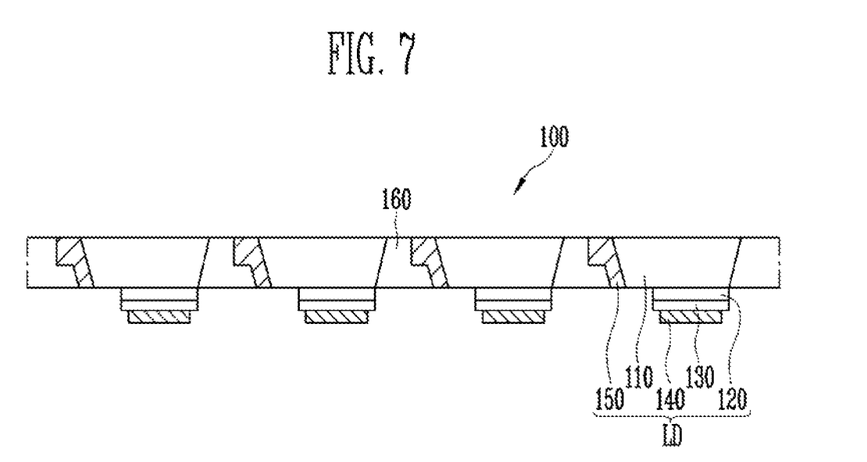

Subsequently, referring to FIGS. 5 and 7, there is formed a light emitting array 100 from which the semiconductor substrate (see 100a of FIG. 6) is removed. Here, the semiconductor substrate 100a may be removed through a lift-off process or the like. As the semiconductor substrate 100a is removed, one surface of the second electrode of the light emitting element LD, one surface of the second semiconductor layer 110 of the light emitting element LD, and one surface of the insulating pattern 160 may be exposed to the outside.

Figure 8:
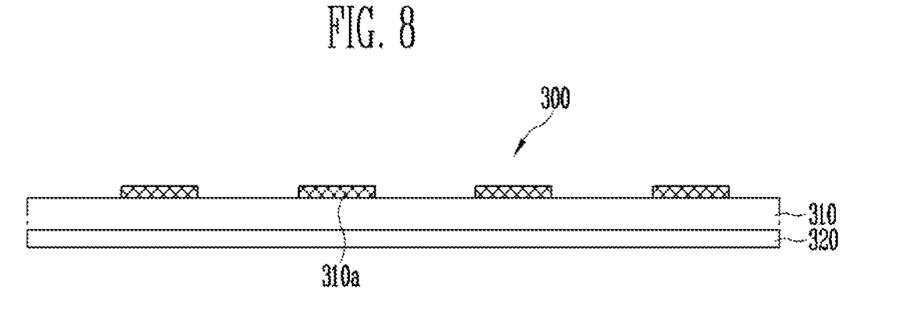

Continuously, referring to FIGS. 5 and 8, a driving array 300 is prepared. The driving array 300 may include a printed circuit board 310 and a heat dissipation layer 320 provided on a back surface of the printed circuit board 310.

The printed circuit board 310 may include a driver (not shown) that drives the plurality of light emitting elements LD and a first contact electrode 310a configured to be electrically connected to the first electrode 140 of a corresponding light emitting element LD.

Figure 9:
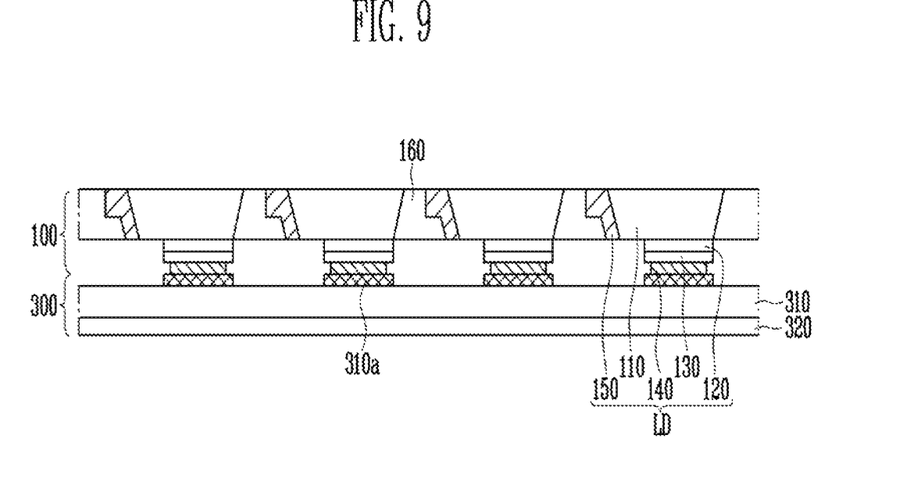

Continuously, referring to FIGS. 5 and 9, the light emitting array 100 and the driving array 300 are electrically and/or physically bonded to each other. Here, the bonding of the light emitting array 100 and the driving array 300 may mean that the light emitting element LD of the light emitting array 100 is mounted on the printed circuit board 310 of the driving array 300.

In this case, the first electrode 140 of the light emitting element LD of the light emitting array 100 may be electrically connected to the first contact electrode 310a of the driving array 300. Therefore, each light emitting element LD may be disposed on the printed circuit board 310 in a flip chip form.

Figure 10:
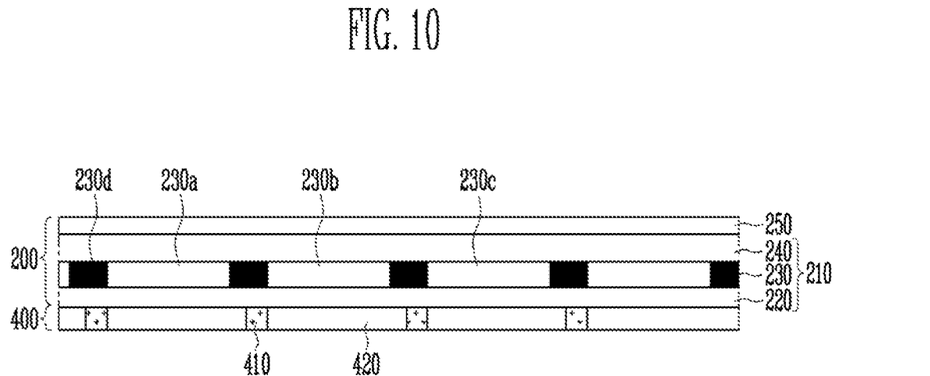

Referring to FIGS. 5 and 10, there are prepared a color conversion layer 200 and an adhesive layer 400 adhered to the color conversion layer 210.

The color conversion array 200 may include a color conversion layer 210 and a coating layer 250 disposed on one surface of the color conversion layer 210.

The color conversion layer 210 may include first and second base substrates 240 and 220, and a sub-color conversion part 230 disposed between the two base substrates 240 and 220. Here, the sub-color conversion part 230 may include first to third sub-color conversion parts 230a, 230b, and 230c, and a black matrix 230d disposed between the first to third sub-color conversion parts 230a, 230b, and 230c.

The coating layer 250 may be an anti-reflection layer that is disposed on the first base substrate 240 and prevents external light from being reflected from the first base substrate 240.

The adhesive layer 400 may be disposed on the second base substrate 220 and include a second contact electrode 410 and an adhesive film 420. The adhesive film 420 may be made of a transparent silicon material to be adhered to the second base substrate 220.

Figure 11:
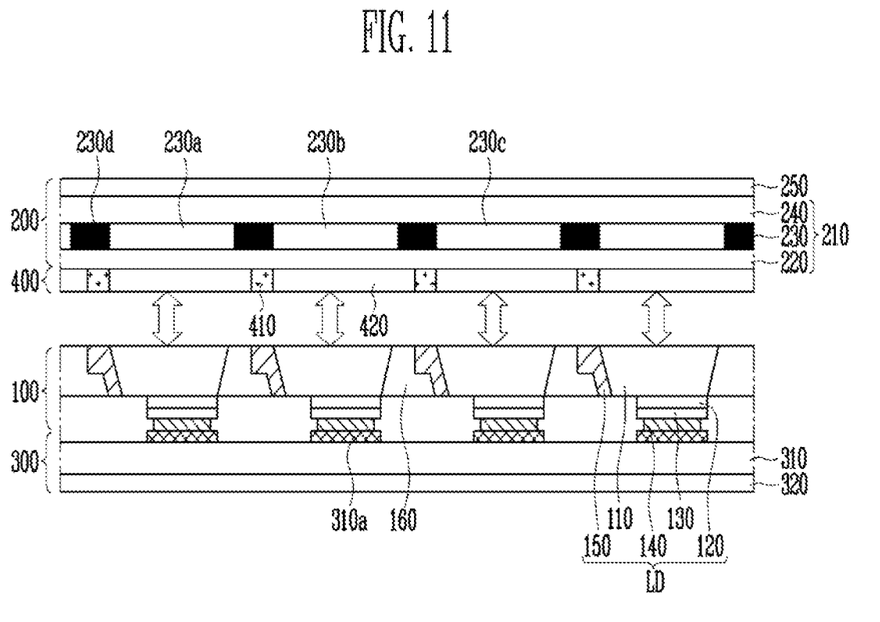

Referring to FIGS. 5 and 11, the color conversion array 200 is disposed on the top of the light emitting array 100 which is attached to the driving array 300. Here, the color conversion array 200 may be disposed such that the other surface that faces one surface of the adhesive layer 400 adhered to the color conversion array 200 is toward the light emitting array 100.

Figure 12:
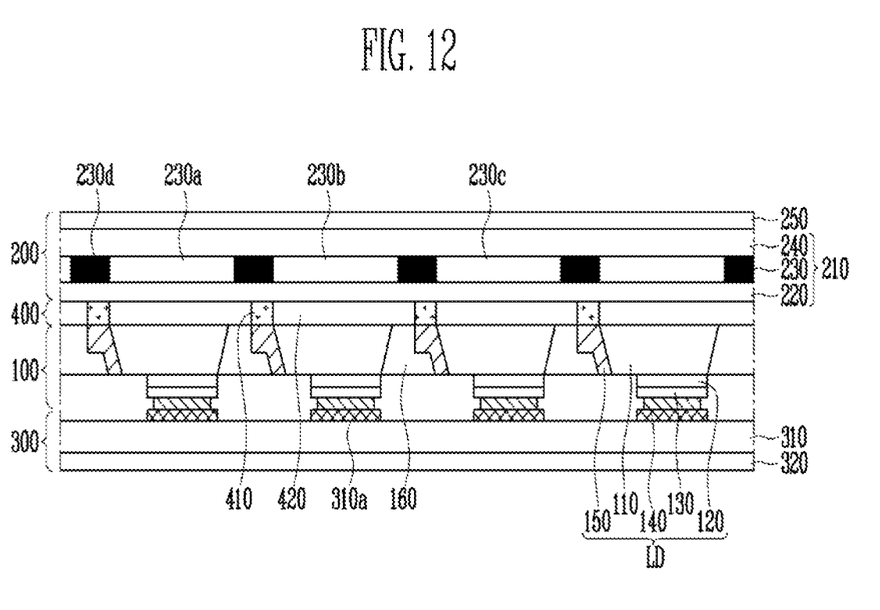

Continuously, as shown in FIG. 12, the color conversion array 200 adhered to the adhesive layer 400 is electrically and/or physically bonded to the light emitting array 100 connected to the driving array 300.

The second contact electrode 410 of the adhesive layer 400 may be electrically connected to the second electrode 150 of the light emitting element LD, which is exposed to the outside. Here, the adhesive film 420 of the adhesive layer 400 may correspond to the insulating pattern 160 and the second semiconductor layer 110, which are exposed to the outside.

Figure 13:
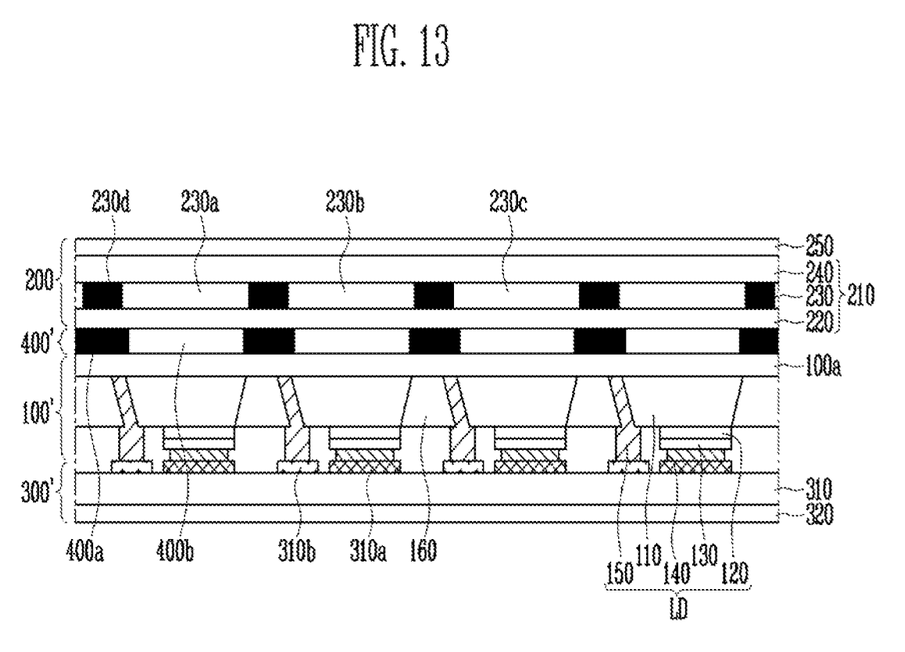
FIG. 13 is a sectional view illustrating a display device according to another embodiment of the present disclosure.

FIG. 13 is a sectional view illustrating a display device according to another embodiment of the present disclosure. In the embodiment of the present disclosure, differences from the above-described embodiment will be mainly described to avoid redundancy. Portions not particularly described in this embodiment follow those of the above-described embodiment. In addition, identical reference numerals refer to identical components, and similar reference numerals refer to similar components.

Referring to FIG. 13, the display device according to the embodiment of the present disclosure may include a light emitting array 100', a color conversion array 200, and a driving array 300'. Also, the display device according to the embodiment of the present disclosure may include an adhesive layer 400' disposed between the light emitting array 100' and the color conversion array 200.

The light emitting array 100' may include a semiconductor substrate 100a, a plurality of light emitting elements LD that generate light, and an insulating pattern 160 disposed between the light emitting elements LD.

The plurality of light emitting elements LD may be disposed on the semiconductor substrate 100a. Each light emitting element LD may be a light emitting diode (LED) that includes a first semiconductor layer 130, an active layer 120, a second semiconductor layer 110, a first electrode 140, and a second electrode 150.

The semiconductor substrate 100a may be a gallium nitride (GaN) substrate, but the present disclosure is not limited thereto. For example, the semiconductor substrate 100a may be any one substrate selected from a sapphire substrate, a silicon (Si) substrate, a silicon carbide (SiC) substrate, a gallium arsenide (GaAs) substrate, and zinc oxide (ZnO) substrate.

The driving array 300' may include a printed circuit board 310 and a heat dissipation layer 320.

The printed circuit board 310 may include a driver (not shown), a first contact electrode 310a, and a second contact electrode 310b.

The driver may be electrically connected to the first contact electrode 310a, and apply a first power source to the first contact electrode 310a. Also, the driver may be electrically connected to the second contact electrode 310b, and apply a second power source to the second contact electrode 310b. Here, the first and second power sources are voltages having levels different from each other, and may be voltages for allowing a corresponding light emitting element LD to emit light.

The first contact electrode 310a may be electrically connected to the first electrode 140 of the corresponding light emitting element LD, and the second contact electrode 310b may be electrically connected to the second electrode 150 of the corresponding light emitting element LD. Here, the first and second contact electrodes 310a and 310b may be spaced apart from each other on the printed circuit board 310 and be electrically insulated from each other. Therefore, each light emitting element LD may be disposed on the printed circuit board 310 in a flip chip form.

The color conversion array 200 may include a color conversion layer 210 and a coating layer 250. Here, the color conversion layer 210 may include first and second base substrates 240 and 220, and a sub-color conversion part 230 disposed between the two base substrates 240 and 220.

The adhesive layer 400' may be disposed between the light emitting array 100' and the color conversion array 200, and allow the light emitting array 100' and the color conversion array 200 to be adhered to each other. The adhesive layer 400' may include light blocking layers 400a and an adhesive film 400b.

In order to prevent light leakage of the plurality of light emitting elements LD, the light blocking layer 400a may be disposed in the adhesive layer 400 to correspond to the insulating pattern 160 of the light emitting array 100' and an upper portion of the second electrode 150 of each light emitting element LD. The light blocking layer 400a may be a black matrix, but the present disclosure is not limited thereto. The light block layer 400a may be made of materials including a material for preventing the light leakage.

The adhesive film 400b may be disposed between the light blocking layers 400a in the adhesive layer 400'. Also, the adhesive film 400b may be disposed between the semiconductor substrate 100a of the light emitting array 100' and the second base substrate 220 of the color conversion array 200 to allow the light emitting array 100' and the color conversion array 200 to be bonded to each other.

As described above, the first electrode 140 of the light emitting element LD may be electrically connected to the first contact electrode 310a of the printed circuit board 310, and the second electrode 150 of the light emitting element LD may be electrically connected to the second contact electrode 310b of the printed circuit board 310. Thus, the light emitting element LD can generate light with a luminance corresponding to the first and second power sources respectively provided to the first and second electrodes 140 and 150 thereof.

The light emitting element LD may be electrically insulated from an adjacent light emitting element LD by the insulating pattern 160 in the light emitting array 100', and be electrically connected to each of the first and second contact electrodes 310a and 310b of the printed circuit board 310. Accordingly, the light emitting device LD can be individually driven.

The above-described display device may be coupled to another display device to implement a large-sited screen. In this case, each display device has a connector (not shown) to be mounted on the printed circuit board 310, the display device can be coupled to an adjacent display device through the connectors.

Further, in the above-described display device, a display element is configured through a plurality of light emitting elements LD arranged in a matrix form in the light emitting array 100', so that a bezel-less structure can be implemented.

The display device according to the embodiment of the present disclosure can be employed in various electronic devices. For example, the display device is applicable to televisions, notebook computers, cellular phones, smart phones, smart pads, PMPs, PDAs, navigations, various wearable devices such as smart watches, and the like.

According to the present disclosure, it is possible to provide a display device having improved reliability.

Also, according to the present disclosure, it is possible to provide a manufacturing method of the display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:
1. A display device comprising:
a light emitting array including a substrate, a plurality of light emitting elements disposed in a matrix form on the substrate, the plurality of light emitting elements generating light, and an insulating pattern disposed between the light emitting elements;
a color conversion array including a plurality of sub-color conversion parts corresponding to the respective light emitting elements, the plurality of sub-color conversion parts each converting the light into light of a specific color for each of the plurality of light emitting elements and emitting the converted light; and
a printed circuit board having a first contact electrode connected to each of the plurality of light emitting elements, the printed circuit board driving the plurality of light emitting elements,
wherein the plurality of sub-color conversion parts include first to third sub-color conversion parts that convert the light provided from corresponding light emitting elements into lights of first to third colors and emitting the converted lights, and
wherein each of the plurality of light emitting elements is electrically insulated from an adjacent light emitting element.

2. The display device of claim 1, wherein each light emitting element includes:
an active layer;
a first semiconductor layer disposed on the active layer;
a first electrode disposed on the first semiconductor layer;
a second semiconductor layer disposed between the active layer and the substrate; and
a second electrode disposed between the second semiconductor layer and the insulating pattern.

3. The display device of claim 2, wherein the first electrode is electrically connected to the first contact electrode.

4. The display device of claim 2, further comprising an adhesive layer disposed between the color conversion array and the light emitting array.

5. The display device of claim 4, wherein the adhesive layer includes a second contact electrode electrically connected to the second electrode and an adhesive film disposed corresponding to the first semiconductor layer.

6. The display device of claim 4, wherein the printed circuit board further includes a second contact electrode electrically connected to the second electrode.

7. The display device of claim 6, wherein the second contact electrode is spaced apart from an adjacent second contact electrode at a predetermined distance on the printed circuit board, and is electrically insulated from the first contact electrode.

8. The display device of claim 6, wherein the adhesive layer includes an adhesive film disposed corresponding to the first semiconductor layer and a light blocking layer disposed corresponding to the insulating pattern.

9. The display device of claim 8, wherein the adhesive film includes a transparent silicon material, and the light blocking layer includes a black matrix.

10. The display device of claim 1, wherein the first sub-color conversion part includes a first quantum dot that emits light of the first color, and the second sub-color conversion part includes a second quantum dot that emits light of the second color.

11. The display device of claim 10, wherein the light of the first color is red light, and the light of the second color is green light.

12. The display device of claim 1, wherein each of the plurality of light emitting elements includes a light emitting diode that emits blue light.

13. The display device of claim 12, wherein at least one sub-color conversion part among the first to third sub-color conversion parts includes a transparent layer that allows the blue light to be transmitted therethrough.

14. A method of manufacturing a display device, the method comprising:
forming a light emitting array, wherein the light emitting array includes a plurality of light emitting devices that generate light and an insulating pattern provided between the plurality of light emitting elements;
forming a printed circuit board, wherein the printed circuit board includes a first contact electrode;
mounting the light emitting array on the printed circuit board such that each light emitting element is electrically connected to the first contact electrode;
forming a color conversion array, wherein the color conversion array includes a plurality of sub-color conversion parts that correspond to the respective light emitting elements and each converts the light into light of a specific color for each of the plurality of light emitting elements and emits the converted light; and
disposing the color conversion array on the top of the light emitting array and then allowing the light emitting array and the color conversion array to be bonded to each other,
wherein the plurality of sub-color conversion parts include first to third sub-color conversion parts, at least one of the first to third sub-color conversion parts converting the light provided from corresponding light emitting elements into light of first color and emitting the converted light.

15. The method of claim 14, wherein the forming of the light emitting array includes:
forming a plurality of second semiconductor layer patterns on a semiconductor substrate;
forming the insulating pattern between adjacent second semiconductor layer patterns;
forming a second electrode between each of the second semiconductor layer patterns and the insulating pattern;
forming an active layer on the second semiconductor layer;
forming a first semiconductor layer on the active layer; and
forming a first electrode on the first semiconductor layer.

16. The method of claim 15, further comprising removing the semiconductor substrate through a lift-off process.

17. The method of claim 15, further comprising forming an adhesive layer on the color conversion array.

18. The method of claim 17, wherein the adhesive layer includes a second contact electrode electrically connected to the second electrode and an adhesive film disposed corresponding to the first semiconductor layer.

19. The method of claim 15, wherein the forming of the printed circuit board further includes forming a second contact electrode electrically connected to the second electrode.

20. The method of claim 19, wherein the second contact electrode is spaced apart from an adjacent second contact electrode at a predetermined distance on the printed circuit board, and is electrically insulated from the first contact electrode.

* * * * *